United States Patent [19]
Yamazaki et al.

[11] Patent Number: 5,894,137
[45] Date of Patent: Apr. 13, 1999

[54] SEMICONDUCTOR DEVICE WITH AN ACTIVE LAYER HAVING A PLURALITY OF COLUMNAR CRYSTALS

[75] Inventors: Shunpei Yamazaki, Tokyo; Hisashi Ohtani; Takeshi Fukunaga, both of Kanagawa, all of Japan

[73] Assignee: Semiconductor Energy Laboratory Co., Ltd., Kanagawa-ken, Japan

[21] Appl. No.: 08/820,408

[22] Filed: Mar. 12, 1997

[30] Foreign Application Priority Data

Mar. 12, 1996 [JP] Japan .................................. 8-083144

[51] Int. Cl.$^6$ .................................................. H01L 31/036
[52] U.S. Cl. .................. 257/66; 257/59; 257/69; 257/72; 257/285; 257/287; 257/347; 257/506; 438/166; 438/175; 438/486; 438/571
[58] Field of Search .................. 257/59, 66, 69, 257/72, 75, 103, 285, 286, 287, 347, 350, 506, 623, 655; 438/166, 175, 486, 571

[56] References Cited

U.S. PATENT DOCUMENTS 5,604,360   2/1997   Zhang et al. .................................. 257/72

*Primary Examiner*—Tom Thomas
*Assistant Examiner*—Fetsum Abraham
*Attorney, Agent, or Firm*—Fish & Richardson P.C.

[57] ABSTRACT

There is provided a technique for fabricating a thin film transistor having excellent performance. A configuration is employed in which when the thin film transistor is in an on-state, the flowing direction of the on-current coincides with the direction of crystal growth. With such a configuration, grain boundaries of the crystalline silicon in the active layer will not block the on-current. Further, when the thin film transistor is in an off-state, the off-current is always orthogonal to the grain boundaries of the crystalline silicon. The grain boundaries of the crystalline silicon effectively suppresses the off-current in such locations.

18 Claims, 11 Drawing Sheets

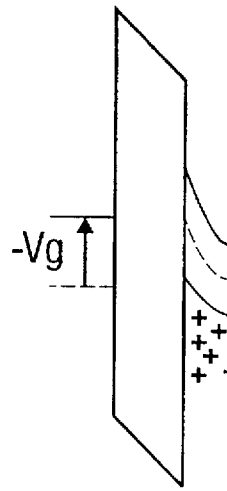
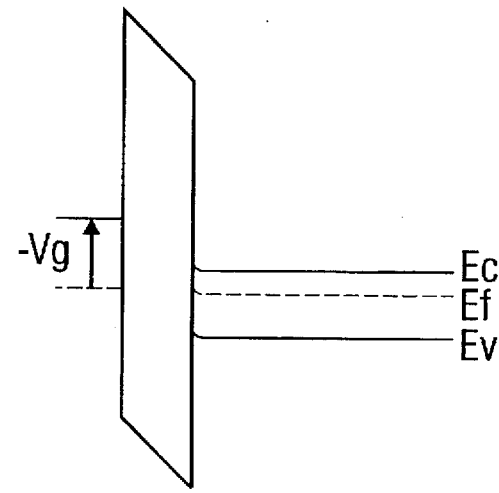
FIG. 2A  FIG. 2B
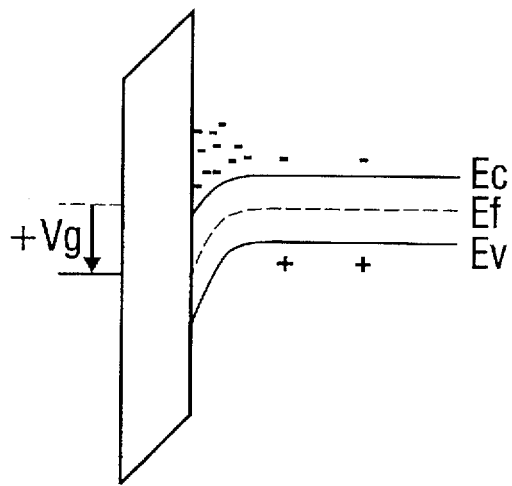
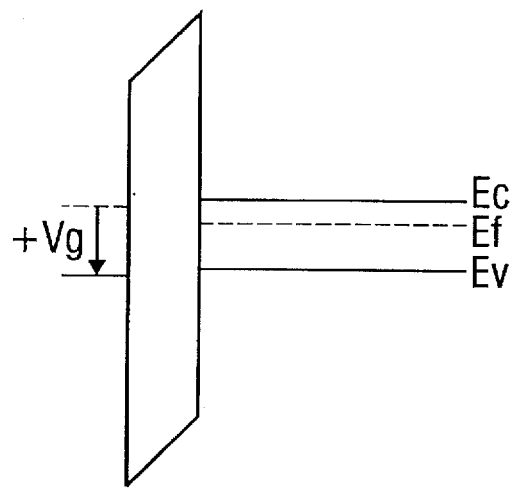
FIG. 2C  FIG. 2D

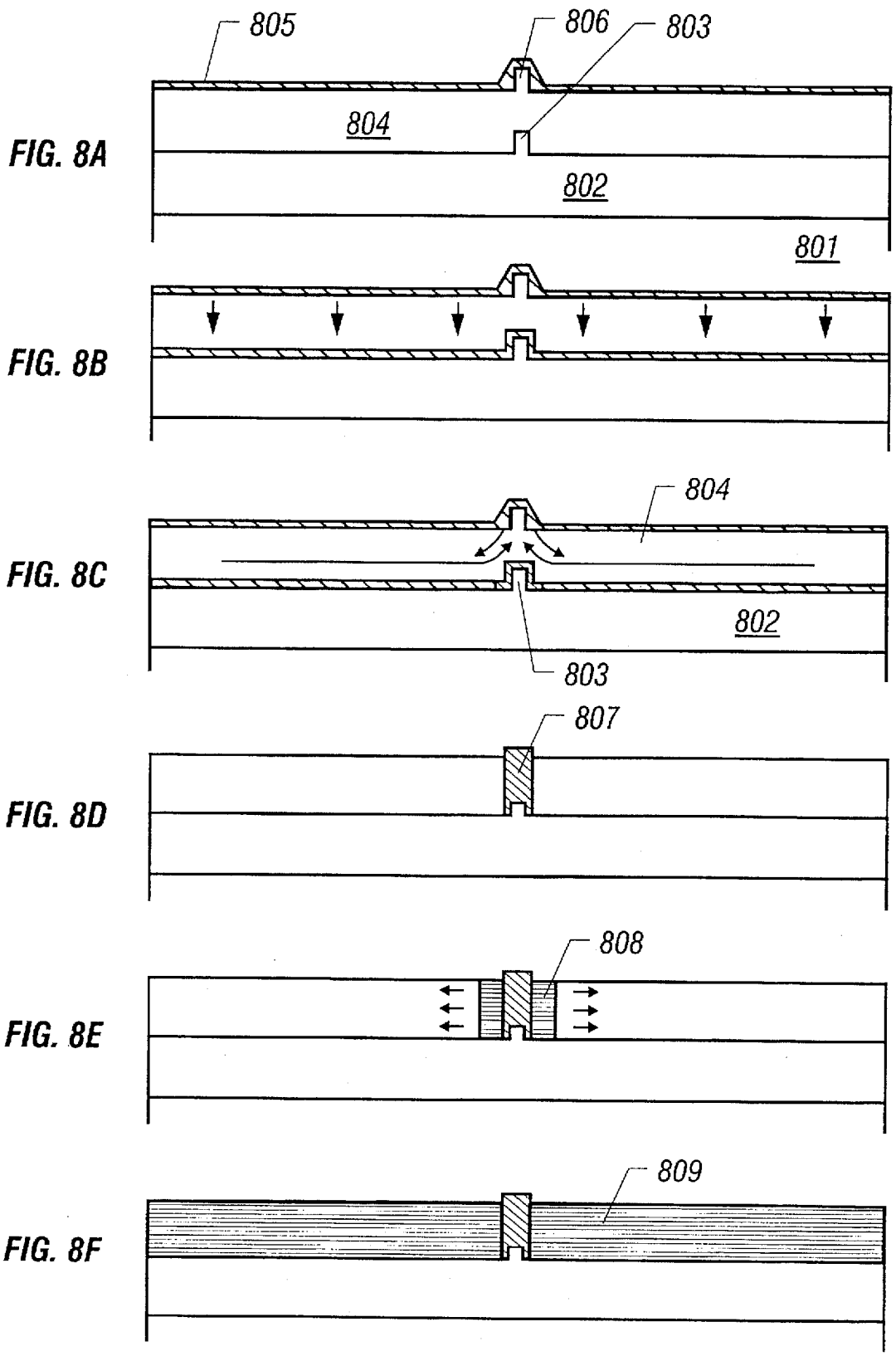

IMPURITY IONS

SEMICONDUCTOR DEVICE WITH AN ACTIVE LAYER HAVING A PLURALITY OF COLUMNAR CRYSTALS

BACKGROUND OF THE INVENTION

1. Field of the Invention

The present invention relates to a semiconductor device utilizing a crystalline thin film transistor and a method of manufacturing the same and, more particularly, to a thin film transistor (TFT). The present invention can be applied to thin film transistors of any type such as planar and reverse staggered types.

2. Description of Related Art

Recently, techniques for fabricating thin film transistors on an inexpensive glass substrate have been rapidly advancing. Especially, thin film transistors utilizing a thin film semiconductor as an active layer have made remarkable progress. Silicon films are commonly used as thin film semiconductors, and thin film transistors utilizing amorphous silicon films have already been put in use.

However, progress in the development of active matrix type liquid crystal displays and the like wherein a pixel region and a driving circuit are integrated has resulted in an increased need for thin film transistors for such driving circuits operating at a high speed. As a result, conventional thin film transistors utilizing amorphous silicon films have become insufficient to achieve required characteristics.

Under such circumstances, there is a recent trend toward thin film transistors whose active layer is constituted by a crystalline silicon film obtained by crystallizing an amorphous silicon film. In a crystalline silicon film (excluding single crystal silicon films), however, the presence of trap levels of a high density at grain boundaries of the crystalline silicon results in migration of carriers through such traps which causes an off-current to flow.

Such an off-current is a current flowing through the channel region of a thin film transistor in the off-state. The off-current can prevent charge stored in the thin film transistor from being maintained for a long time when the transistor is used as a switching device for a capacitor formed by a pixel electrode or the like in a liquid crystal display or the like.

SUMMARY OF THE INVENTION

During research and development of thin film transistors utilizing a crystalline silicon film as described above, the inventors have conceived a technique for forming an active layer having a unique configuration. This technique has already been reported in U.S. patent application Ser. No. 08/759,565 by the inventors and is based on a principle that lengths of substantial channel regions of a thin film transistor in an on-state (selected state) and in an off-state (unselected state) are different as to increase an effective channel length in the off-state, thereby reducing the off-current. This technique will be generally described below.

FIG. 1(A) shows a semiconductor layer in the form of an island to serve as an active layer of a thin film transistor. A region 100 of this semiconductor layer in the form of islands sandwiched by a region 101 to serve as a source and a region 102 to serve as a drain is subjected to selective ion implantation to form regions 103 through 105 of one conductivity type (these regions are particularly referred to as "floating island regions").

The conductivity of the floating island regions 103 through 105 is the same as that of the region 101 to serve as a source and the region 102 to serve as a drain and is obtained by implanting P+ ions in a dose of $1 \times 10^{12} - 1 \times 10^{14}$ atoms/cm$^2$, more preferably $3 \times 10^{12} - 3 \times 10^{13}$ atoms/cm$^2$ when, for example, an N-channel type TFT is to be fabricated.

On this occasion, the floating island regions 103 through 105 are not necessarily required to be contact with the periphery of the semiconductor layer in the form of islands as shown in FIG. 1(A). That is, they may be in the form of islands scattered in the region 100.

A region 106 in the region 100 which has not been subjected to ion implantation is substantially intrinsic and is a region where a channel is to be formed (this region is particularly referred to as "base region").

A brief description will now be made on the electrical characteristics of a thin film transistor fabricated utilizing a semiconductor layer in the form of islands which has been subjected to the above-mentioned ion implantation. The following description refers to an N-channel type TFT as an example.

In the semiconductor layer in the form of islands having the configuration as shown in FIG. 1(A), when the thin film transistor is in the off-state, there are high potential barriers (energy barriers) at the boundaries between the base region 106 and the floating island regions 103 through 105, which allows almost no migration of carriers. As a result, carriers move in a path formed only by the base region 106, and a current (off-current) caused by the carrier migration is observed in the direction of the arrows in FIG. (A).

Meanwhile, when the thin film transistor is in the on-state, the base region 106 is inverted to make the potential barriers at the boundaries between itself and the floating island regions 103 through 105 very small. This results in easy migration of carriers between the base region 106 and the floating island regions 103 through 105, and a current (on-current) caused by the carrier migration will be observed along the path indicated by the arrow in FIG. 1(B).

A brief description will be made with reference to FIGS. 2(A) through 2(D) on such a change in the potential barrier caused by transition between the off-state and on-state of the thin film transistor. In FIGS. 2(A) through 2(D), Vg represents a gate voltage (Vg>0); Ec represents a conduction band; Ev represents a valence band; and Ef represents a Fermi level.

First, when the thin film transistor is in the off-state (a state wherein a negative voltage is applied to the gate), the base region 106 is in a band condition as shown in FIG. 2(A). Specifically, holes which are minor carriers are concentrated at the surface of the semiconductor to eliminate electrons in that region, which results in slight migration of holes between the source and drain. This is observed as the off-current.

Meanwhile, in the floating island regions 103 through 105 which have been subjected to implantation of P+ ions, the Fermi level Ef has been raised into the vicinity of the conduction band Ec. At this time, the floating island regions 103 through 105 are in a band condition as shown in FIG. 2(B).

As shown in FIG. 2(B), in the floating island regions 103 through 105 which are an N-type semiconductor layer, application of a negative voltage to the gate results in only small deflection of the energy band.

Therefore, the difference between the energy of the valence band at the surface of the semiconductor in FIG. 2(A) and the energy of the valence band at the surface of the semiconductor in FIG. 2(B) establishes a potential barrier. This prevents holes from moving between the base region 106 and the floating island regions 103 through 105 back and forth.

Next, when the thin film transistor is in the on-state (a state wherein a positive voltage is applied to the gate), the base region 106 is in a band condition as shown in FIG. 2(C). Specifically, since electrons which are majority carriers are accumulated at the surface of the semiconductor, there is migration of electrons between the source and drain.

At this time, the floating island regions 103 through 105 are in a band condition as shown in FIG. 2(D). As shown in FIG. 2(D), as in the case wherein a negative voltage is applied to the gate as described above, almost no deflection occurs in the energy band of the floating island regions 103 through 105 which is an N-type semiconductor layer even when a positive voltage is applied to the gate.

In FIG. 2(D), however, a great number of electrons always exist in the conduction band because the Fermi level Ef has already been raised into the vicinity of the conduction band Ec.

Therefore, when a positive voltage is applied to the gate, since the base region 106 and the floating island regions 103 through 105 are both in a band condition that allows easy migration of electrons, the potential barrier at the boundary between the base region 106 and floating island regions 103 through 105 can be ignored.

As described above, only the base region 106 serves as a path for carrier migration in the off-state, and the base region 106 and floating island regions 103 through 105 serve as a path for carrier migration in the on-state. A simplified model of this process will be briefly described below.

FIG. 3(A) shows the same semiconductor layer as shown in FIG. 1(A). Although not shown, gate electrodes are formed above the base region with a gate insulating film interposed therebetween.

When the thin film transistor is in the on-state, i.e., when a positive voltage is applied to the gate electrodes, an on-current flows in the direction of the solid line indicated by A-A' in FIG. 3(A). The structure in FIG. 3(B) and the circuit diagram in FIG. 3(C) are seen at the section along the line A-A'. Inversion layers 302 are formed in the base region under gate electrodes 301 in FIG. 3(B).

When the thin film transistor is in the off-state, i.e., when a negative voltage is applied to the gate electrodes, an off-current flows in the direction of the broken line indicated by B-B' in FIG. 3(A). The structure in FIG. 3(D) and the circuit diagram in FIG. 3(E) are seen at the section along the line B-B'. Specifically, it can be regarded that a long base region is provided under one long gate electrode 303 as to substantially configure a transistor having an extremely large channel length.

Therefore, when the thin film transistor is in the on-state, carriers move a minimum distance. This substantially results in a short channel length and a wide channel width. Consequently, the on-current observed will have a large value.

On the other hand, when the thin film transistor is in the off-state, carriers move only in the base region. It can be regarded that there is substantially provided a long and narrow channel. That is, there is provided a configuration in which resistive components in the channel region are substantially increased, and the off-current observed will have a small value.

The above-described configuration provides the effect of decreasing the off-current and increasing the on-current significantly with no significant change in the area occupied by the semiconductor layer in the form of islands, i.e., the effect of providing an improved on-off ratio to allow the formation of an active layer having performance higher.

Meanwhile, it has been previously stated that the presence of grain boundaries of the crystalline silicon in the semiconductor layer in the form of islands, i.e., the active layer can lead to an increase in the off-current. It can be assumed that the grain boundaries of the crystalline silicon have considerable influence on the on-current. Because, at a grain boundary of the crystalline silicon, a potential barrier becomes high for reasons including discontinuity of the state of an energy band, it serves as an energy barrier which blocks the movement of carriers such as electrons and holes.

Therefore, in the case of an off-current, carriers move through trap levels at grain boundaries of the crystalline silicon. That is, it is assumed that the current flows along the grain boundaries of the crystalline silicon.

On the other hand, in the case of an on-current, trap levels at grain boundaries of the crystalline silicon capture carriers to hinder the migration of the carriers. The discontinuity of the state of an energy band as described above also hinders the migration of the carriers.

Therefore, with any technique for forming an active layer, the performance of the active layer is inevitably significantly dependent upon grain boundaries of the crystalline silicon therein. This results in a problem in that the electrical characteristics of a thin film transistor having such an active layer are also dependent upon the grain boundaries of the crystalline silicon.

However, since crystal grains are formed in irregular positions, the positions and shapes of grain boundaries of the crystalline silicon are also irregular. This is attributable to irregularity in the formation of crystalline nucleus.

As described above, a problem remains in the manufacture of a thin film transistor having an active layer utilizing a crystalline silicon film in that grain boundaries of the crystalline silicon irregularly existing in the crystalline silicon film significantly affect the performance of the active layer and consequently the electrical characteristics of the thin film transistor.

It is therefore an object of the present invention to propose a technique for solving the above-described problem to form an active layer having excellent performance and to provide a high performance thin film transistor utilizing such an active layer.

According to one aspect of the present invention, there is provided a semiconductor device having an active layer constituted by a crystalline silicon film formed on a substrate having an insulating surface, characterized in that:

the crystalline silicon film includes a lateral growth region formed by a plurality of columnar or acicular crystals substantially parallel with the substrate;

the active layer is constituted only by the lateral growth region and has a configuration including at least a source region, a drain region, floating island regions, and a base region; and the growing direction of the columnar or acicular crystals substantially coincides with the direction in which the source region and the drain region of the active layer are connected at the minimum distance.

According to another aspect of the present invention, there is provided a semiconductor device having an active layer constituted by a crystalline silicon film formed on a substrate having an insulating surface, characterized in that:

the crystalline silicon film includes a lateral growth region formed by a plurality of columnar or acicular crystals substantially parallel with the substrate;

the active layer is constituted only by the lateral growth region and has a configuration including at least a source region, a drain region, floating island regions and a base region; and the grain boundaries of the crystalline silicon of the columnar or acicular crystals are aligned substantially in one direction which substantially coincides with the direction in which the source region and the drain region of the active layer are connected at the minimum distance.

According to another aspect of the present invention, there is provided a semiconductor device having an active layer constituted by a crystalline silicon film formed on a substrate having an insulating surface, characterized in that:

the crystalline silicon film includes a lateral growth region formed by a plurality of columnar or acicular crystals substantially parallel with the substrate;

the active layer is constituted only by the lateral growth region and has a configuration including at least a source region, a drain region, floating island regions and a base region;

when the thin film transistor is in an on-state, the flowing direction of an on-current substantially coincides with the growing direction of the columnar or acicular crystals; and when the thin film transistor is in an off-state, the flowing direction of an off-current includes a directional component perpendicular to the growing direction of the columnar or acicular crystals.

That is, the invention is characterized in that when the active layer is formed, the orientation of the active layer is defined in accordance with the direction of crystal growth. When the thin film transistor is in the on-state, the flowing direction of the on-current substantially coincides with the direction crystal growth and wherein when the thin film transistor is in the off-state, the flowing direction of the off-state is orthogonal to the direction of crystal growth at least in a certain region.

In an active layer having the structure described above, the on-current flows in the direction in which the source region and drain region are connected at the minimum distance. Specifically, according to the present invention, an active layer is formed such that the direction of crystal growth substantially coincides with the direction in which the source region and drain region are connected at the minimum distance.

Further, in an active layer as described above, the off-current is observed when the thin film transistor is in the off-state. Therefore, the flowing direction of the off-current is always orthogonal to the direction of crystal growth.

The present invention having the above-described configurations will be described in detail with reference to preferred embodiments thereof disclosed below.

BRIEF DESCRIPTION OF THE DRAWINGS

FIGS. 2(A) through 2(D) schematically illustrate the condition of an energy band of an active layer.

FIGS. 8(A) through 8(F) illustrate steps for forming a crystalline silicon film in accordance with the second embodiment.

DETAILED DESCRIPTION OF PREFERRED EMBODIMENTS

FIRST EMBODIMENT

Figure 1A:
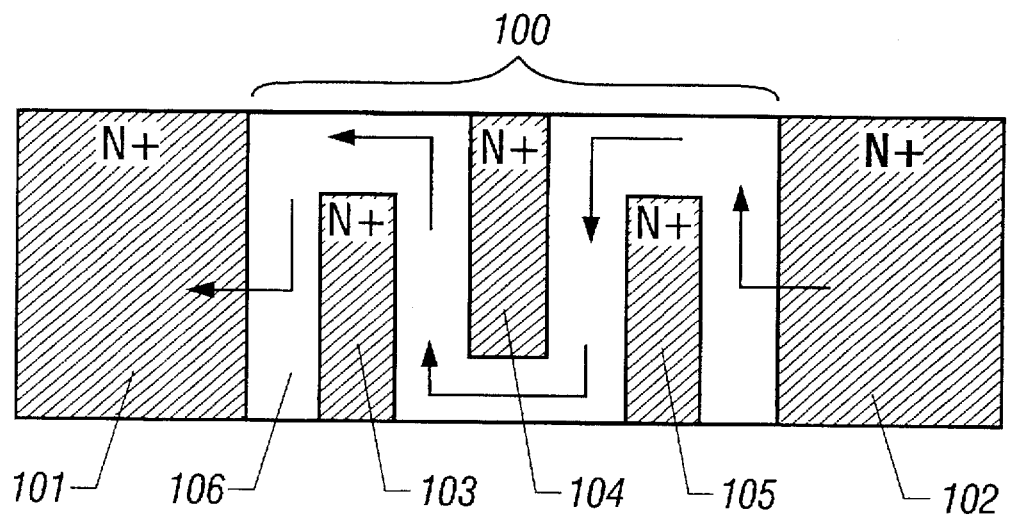
FIGS. 1(A) and 1(B) schematically illustrate the configuration and electrical characteristics of an active layer.
Figure 1B:
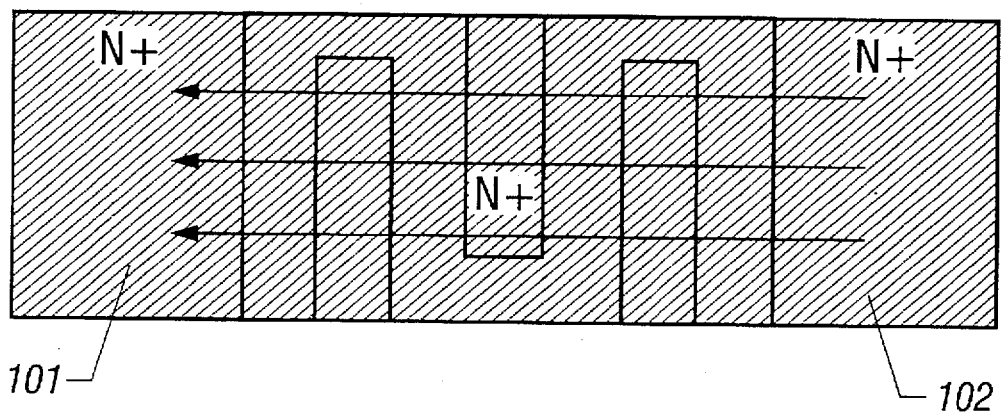

In the present embodiment, a brief description will be made on a technique for forming an active layer at a particular orientation in any crystalline region. The means for crystallizing an amorphous film employed in this embodiment is the technique disclosed in Japanese Patent Laid-Open No. H7-321339 by the inventors.

According to the above-described technique, metal elements for promoting crystallization are selectively added to an amorphous silicon film to cause crystal growth in a direction substantially parallel with a substrate. The crystallized region is particularly referred to as "lateral growth region".

A lateral growth region formed using such a technique is a region in which columnar or acicular crystals collect with their growing directions aligned and which is characterized by excellent crystallinity. It has been proven that a thin film transistor having an active layer formed utilizing such a region exhibits high performance for such a reason.

A description will now be made on a means for forming such a lateral growth region and a means for forming an active layer utilizing such a lateral growth region with reference to FIGS. 4(A) through 4(D).

First, a substrate 401 having an insulating surface is prepared. Here, the term "insulating surface" implies not only the surface of an insulator but also an insulating layer provided on a semiconductor or on the surface of a metal. That is, integrated circuits and thin film transistors formed in accordance with the present invention include not only those formed on an insulating substrate such as glass but also those formed on an insulator provided on a single crystal silicon or an IC formed thereon.

In the present embodiment, a silicon oxide film 402 having a thickness of 2000 Å is formed as an underlayer on a glass substrate (a quartz substrate or silicon substrate may be used instead). This silicon oxide film 402 may be preferably formed by means of a sputtering process using an artificial quartz target.

The sputtering process using an artificial quartz target makes the surface of the oxide silicon film 402 extremely flat and smooth. This is preferable in that spontaneous nucleation originating from the surface condition of the silicon oxide film 402 is suppressed at a subsequent crystallizing step.

Next, an amorphous silicon film 403 is formed to a thickness in the range from 150 to 3000 Å using a plasma CVD process or a low pressure thermal CVD process. When a low pressure thermal CVD process is employed, disilane ($Si_2H_6$), trisilane ($Si_3H_8$) or the like may be used as a film forming gas.

For an amorphous silicon film formed using a low pressure thermal CVD process, the rate of the spontaneous nucleation at the subsequent crystallization is low. This is preferable to achieve lateral growth with a large width since the rate of mutual interference between individual crystals (that prevents the growth) is reduced.

After the amorphous silicon film 403 is formed, ultraviolet light is applied in an oxygen atmosphere to form a very thin oxide film (not shown) on the surface of the amorphous silicon film 403. This oxide film is provided to improve wettability of a solution during a subsequent solution applying step for introducing a metal element (FIG. 4(A)).

Then, a silicon oxide film 404 having a thickness in the range from 500 to 1200 Å is formed by means of a sputtering process using an artificial quartz target, and etching is performed to selectively remove regions where the metal element is to be introduced. That is, this silicon oxide film 404 serves as a mask for selectively introducing a metal element in the amorphous silicon film 403.

Figure 4A:
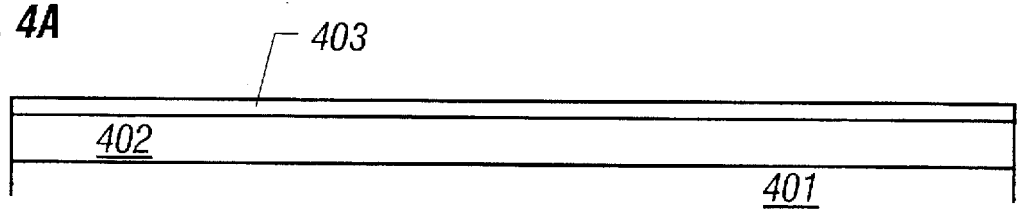
FIGS. 4(A) through 4(D) illustrate steps for forming a crystalline silicon film in accordance with the first embodiment.
Figure 4B:
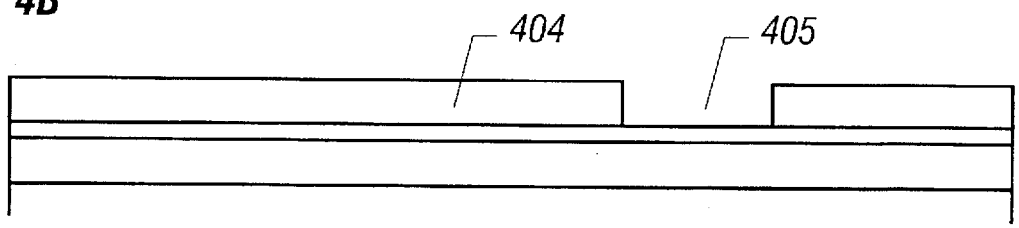

A region 405 exposed by the silicon oxide film 404 (a nickel introduction region) is formed in a slit-like configuration the vertical direction of which is perpendicular to the plane of the drawing (FIG. 4(B)).

Next, a solution including a metal element in a predetermined density is applied to form an aqueous film 406. As the metal element, one or a plurality of elements may be selected from among Fe, Co, Ni, Ru, Rh, Os, Ir, Cu and Au. The present embodiment will be described with reference to Ni (nickel) as an example (FIG. 4(C)).

As a solution including nickel, nickel salt solutions such as a nickel nitrate solution and a nickel acetate solution may be used. Especially, a nickel nitrate solution is preferable because it does not remain in the film after a heating step due to its composition excluding nickel consisting of H, N and O.

Figure 4C:
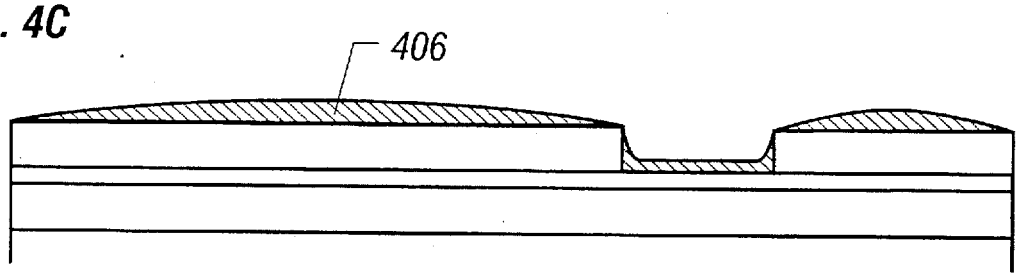
Figure 4D:
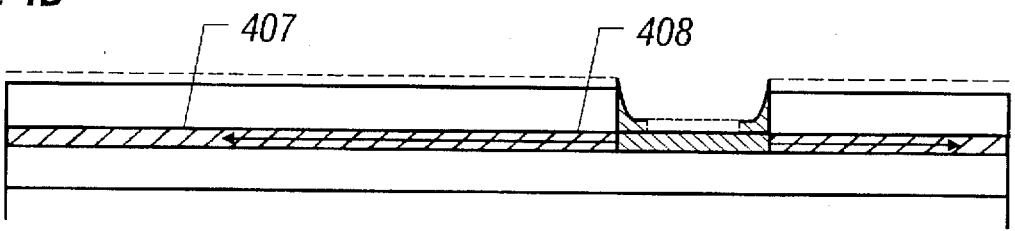

The spin coating is performed using a spinner in the state shown in FIG. 4(C) to realize a state wherein nickel elements are retained in the region 405 on the amorphous silicon film 403 in contact therewith through the oxide film (not shown). At this time, a region including nickel in a high density is formed in the nickel introduction region 405 under influence of the surface tension of the aqueous film 406.

Next, removal of hydrogen (dehydrogenation) is performed in this state for about one hour in an inert atmosphere and, thereafter, a heating process is performed for 4–8 hours at a temperature in the range from 500 to 700° C., typically in the range from 550 to 600° C., in order to crystallize the amorphous silicon film 403. When a glass substrate is used to form the crystalline silicon film 403 thereover, the temperature is preferably equal to or lower than 650° C. taking the heat resisting properties of glass into consideration (FIG. 4(D)).

A crystalline silicon film 407 is obtained through the above-described crystallizing step. When the crystallizing step is finished, the silicon oxide film 404 which served as a mask for selective introduction of nickel is removed. This step may be easily carried out using buffered hydrofluoric acid or the like.

During the above-described crystallizing step, nickel in the region indicated by 405 is diffused into the amorphous silicon film 403 through the oxide film (not shown) to serve as a catalyst for promoting crystallization. Specifically, a silicide is formed as a result of a reaction between nickel and silicon to serve as a nucleus which promotes crystallization.

At this time, the crystal growth is such that columnar or acicular crystals progress in a direction substantially parallel with the substrate. In the present embodiment, the nickel introduction region 405 is in the form of a slit whose vertical direction extends from this side to the other side of the drawing, the crystal growth proceeds substantially in one direction as indicated by the arrow 408. At this time, crystal growth extending several hundred μm or more can achieved.

A lateral growth region obtained as described above is not significantly affected by other crystals because the crystals grown therein are aligned in one direction. Therefore, the lateral growth region seems to be a large crystal grain having a width of several hundred μm or more when macroscopically viewed.

Figure 5A:
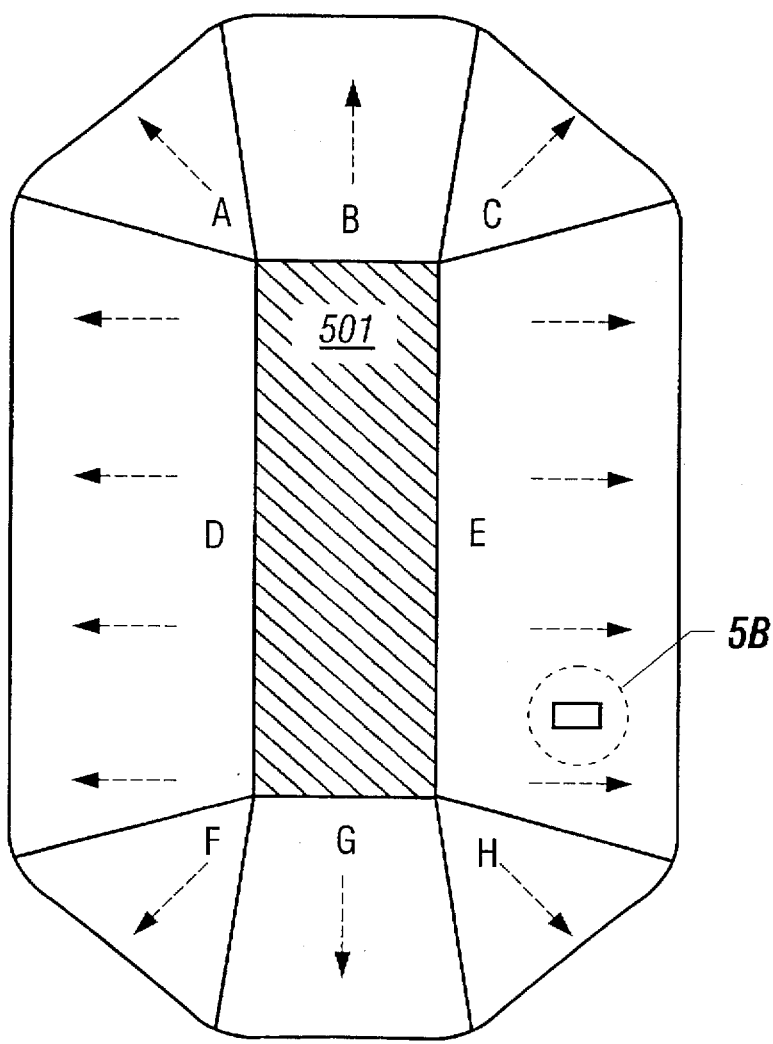
FIGS. 5(A) and 5(B) schematically illustrate a lateral growth region.

This situation is shown in FIG. 5(A) in a simplified manner. In FIG. 5(A), 501 designates a region where nickel has been introduced. Crystal growth starts in this region in the directions indicated by the arrows in broken lines to form about eight regions indicated by A through H. The boundaries between the regions A through H include defects such as slips caused by differences in the direction of crystal growth and are regarded as grain boundaries of the crystalline silicon when macroscopically viewed.

Figure 5B:
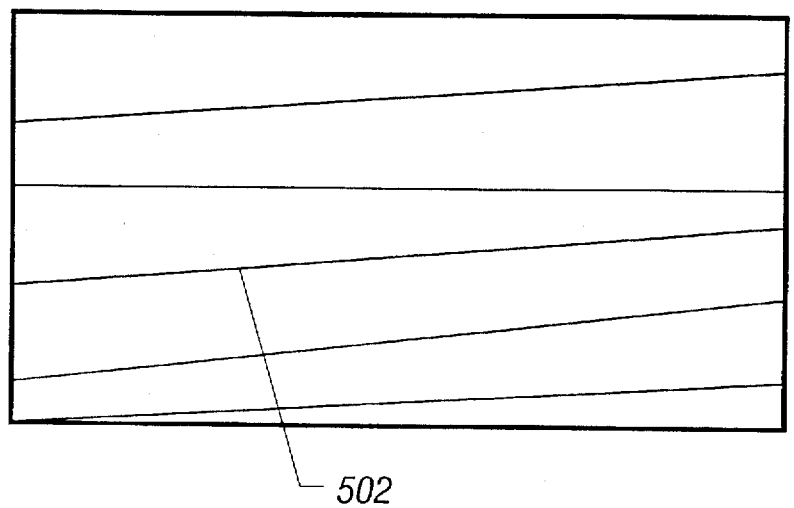

However, the interior of each of the regions A through H is merely a concentration of columnar or acicular crystals when viewed microscopically and, although each of the columnar or acicular crystals can be regarded as a single crystal, they only form a region having relatively high crystallinity as a whole (FIG. 5(B)).

What is important is that each of the regions A through H is a concentration of crystals which can be substantially regarded as a single crystal having a certain directional property. This concentration of crystals which can be substantially regarded as a single crystal has a structure including microscopic grain boundaries of the crystalline silicon indicated by 502. Further, it goes without saying that the grain boundaries of the crystalline silicon are formed in the same direction as the growing direction of the columnar or acicular crystals.

The present invention is based on a principle that an active layer is formed such that the direction in which the source and drain regions are connected at the minimum distance, i.e., the flowing direction of the on-current coincides with the direction of crystal growth in a lateral growth region as described above.

Figure 6A:
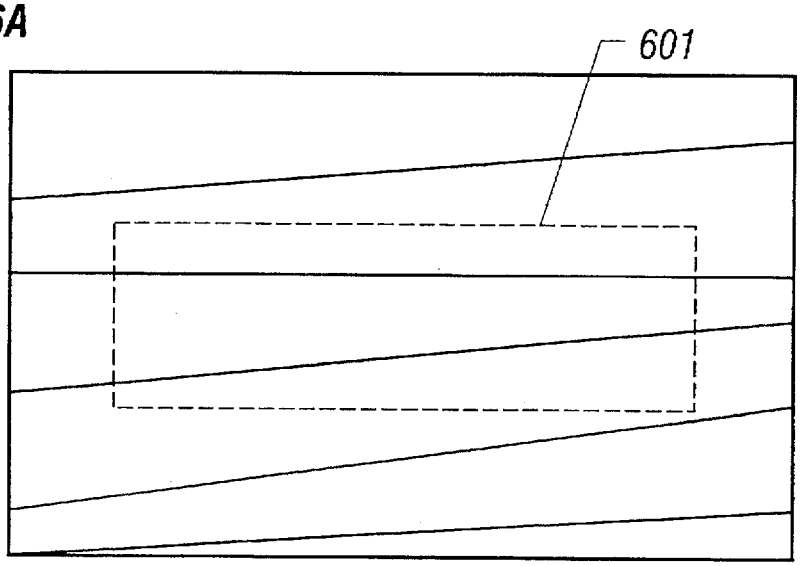
FIGS. 6(A) through 6(D) are views of a model illustrating the behavior of an active layer during the application of a voltage.

Specifically, a lateral growth region having a directional property of crystals as shown in FIG. 6(A) is patterned as indicated by the broken line to form a semiconductor layer 601 in the form of islands which is to constitute an active layer.

Figure 6B:
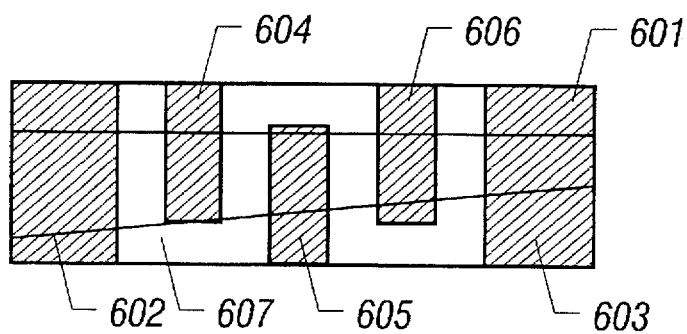

Then, selective ion implantation is carried out on the semiconductor layer in the form of islands to form an active layer constituted by a source region 602, a drain region 603, floating island regions 604 through 606 and a base region 607 (FIG. 6(B)).

As shown in FIG. 6(B), one of the characteristics of the present invention is that the direction in which the source region 602 and the drain region 603 are connected at the minimum distance coincides with the direction of grain boundaries of the crystalline silicon.

A description will now be made on the behavior of carriers during an operation of a thin film transistor having an active layer with the configuration as described above. An N-channel type TFT will be described as an example of such a thin film transistor.

First, when the thin film transistor is in the on-state, since the flowing direction of the on-current is substantially parallel with the direction of crystal growth, the on-current flows in the columnar or acicular crystal grains which can be substantially regarded as a single crystal under almost no influence of the grain boundaries of the crystalline silicon.

Figure 3A:
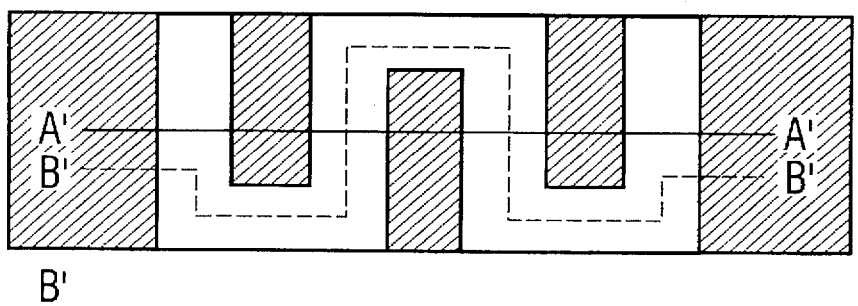
FIGS. 3(A) through 3(E) are views of a model illustrating the behavior of an active layer during the application of a voltage.
Figure 3B:
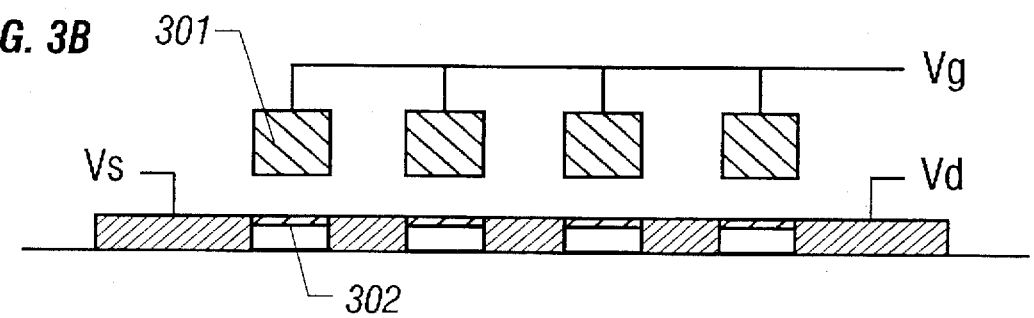
Figure 3C:
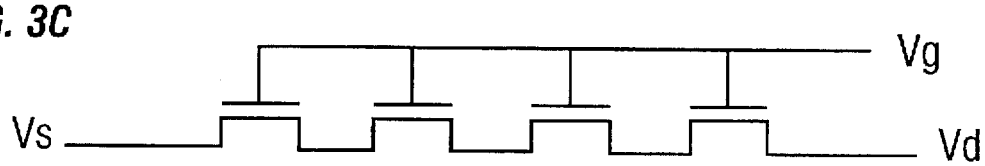
Figure 3D:
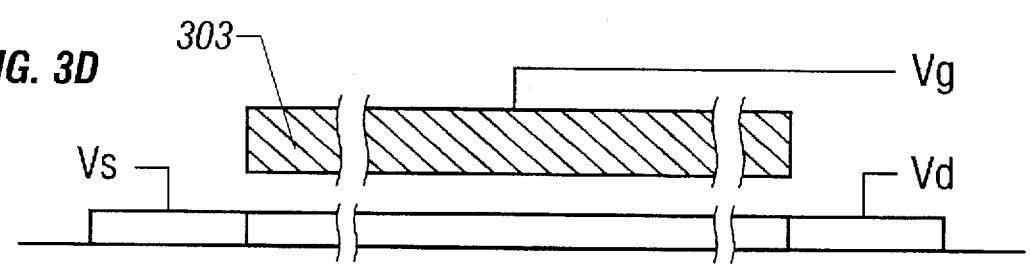
Figure 3E:
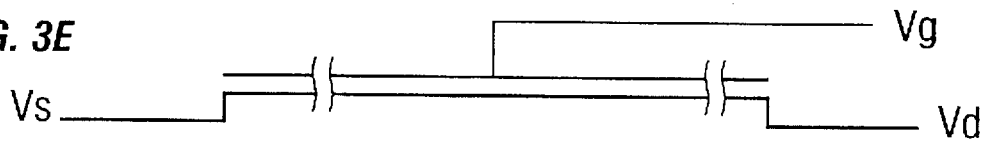
Figure 6C:
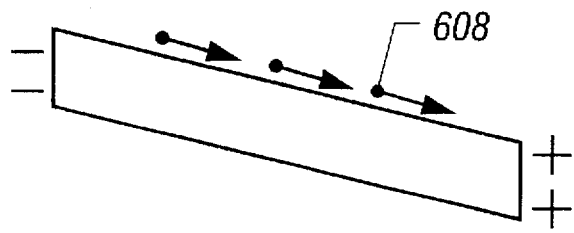

FIG. 6(C) is a view of a model (a simplified energy band diagram) illustrating the movement of carriers (electrons here) in this state. In FIG. 6(C), 608 designates carriers. The energy band diagram is shown in the direction of the solid line indicated by A–A' in FIG. 3(A).

Since a drain voltage (+Vd) is applied between the source and drain, a view of an energy band between the source and drain has a gradient as shown in FIG. 6(C) along which electrons move.

At this time, although the direction in which the source region 602 and the drain region 603 are connected at the minimum distance passes through the floating island regions 604 through 606 and the base region 607, the movement of electrons is not hindered because there is a very small potential barrier as described above.

Further, since electrons flow in the columnar or acicular crystal grains under almost no influence of the grain boundaries of the crystalline silicon, electrons move through a flat route having no energy barrier.

Therefore, the thin film transistor can be always stably operated whether there is a grain boundary of the crystalline silicon in the active layer or not, because a grain boundary does not hinder the flow of the on-current.

Meanwhile, when the thin film transistor is in the off-state, the off-current flows in a direction perpendicular to the direction of crystal growth everywhere in the base region. As a result, the grain boundaries of the crystalline silicon act as potential barriers, thereby hindering the flow.

Figure 6D:
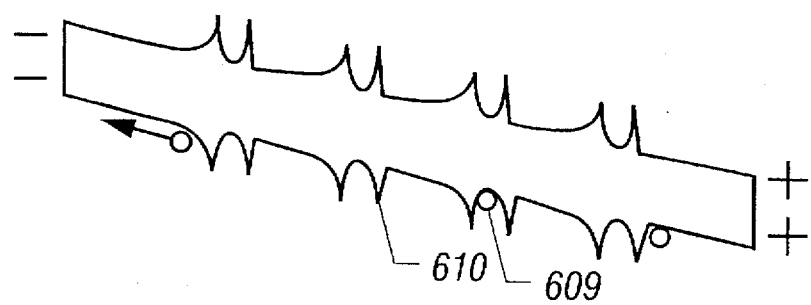

FIG. 6(D) is a view illustrating the movement of carriers (holes here) in this state. In FIG. 6(D), 609 designates holes. Further, the energy band is shown in the direction of the solid line indicated by B–B' in FIG. 3(A).

In this case, there are high potential barriers between the floating island regions 604 through 606 and the base region 607, and holes flow only in the base region 607. This means a substantial increase in the channel length. Further, this causes holes to cross grain boundaries of the crystalline silicon inevitably while they move in the base region 607.

Since the potential barriers have become extremely high at the grain boundaries of the crystalline silicon, the moving path of holes includes many steep potential barriers 610.

Thus, high potential barriers 610 are formed by present of the grain boundaries of the crystalline silicon in the active layer, and holes can not easily cross the potential barriers 610. That is, such regions act as resistive components that hinder the flow of the off-current, thereby effectively suppressing the off-current.

Since each of the regions indicated by A through H in FIG. 5(A) is formed as a result of crystal growth in the direction of the arrow shown in broken lines, a problem arises in that when a plurality of active layers are provided on the same substrate, the orientation of the active layers can not be aligned.

In such a case, this embodiment may be implemented by forming the region where nickel is introduced in such an elongate configuration that it can be regarded linear and by providing it on the entire surface of the substrate in the form of stripes (However, the width of the same is preferably 10 μm or more when the surface tension of the aqueous film including nickel is taken into consideration).

Figures 7A, 7B:
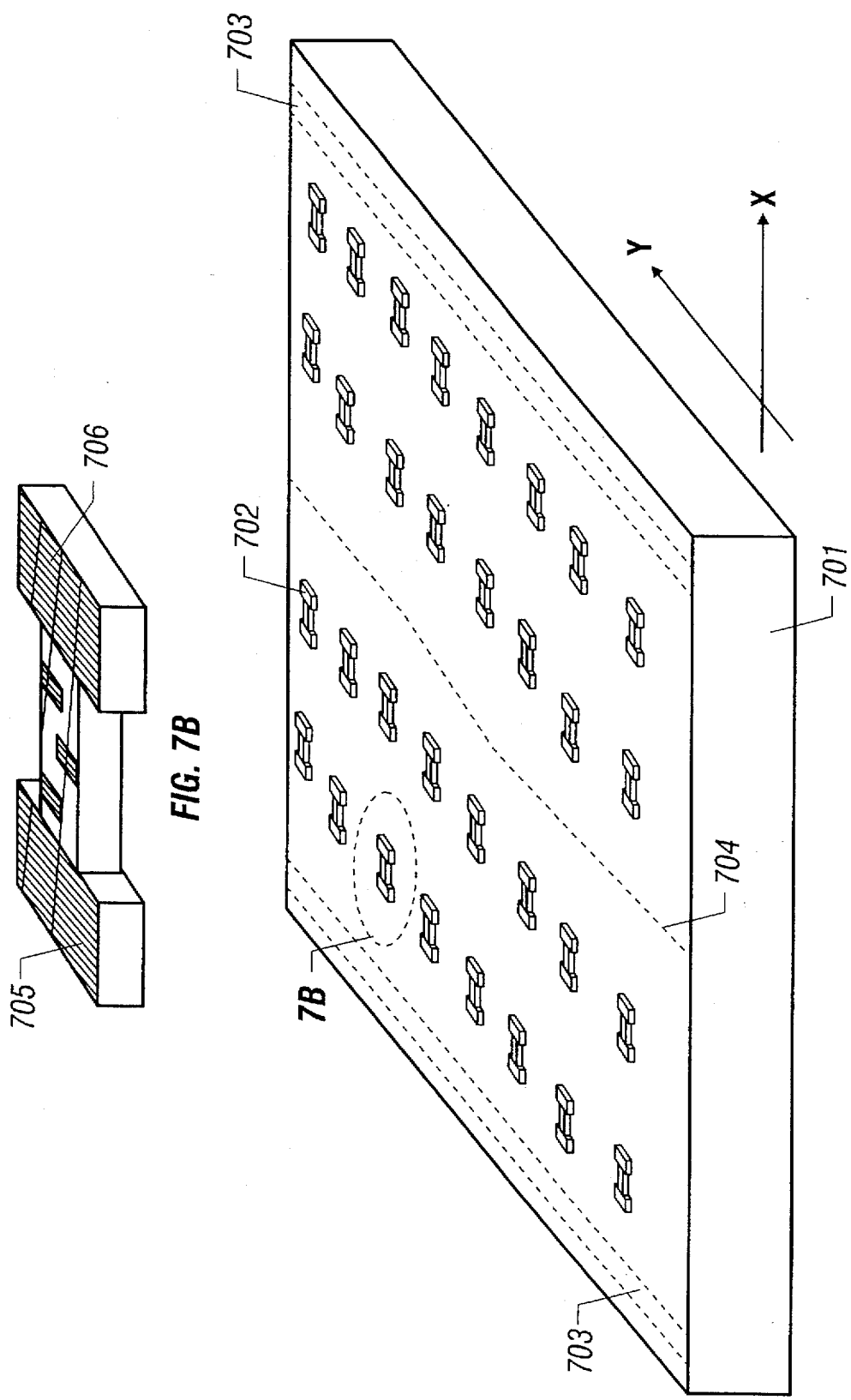
FIG. 7 illustrates a configuration of an active layer formed on a lateral growth region.

This makes it possible to form a lateral growth layer in which crystals are formed in a direction perpendicular to the vertical direction over a wide range. Specifically, a configuration is obtained in which most of the lateral growth region is occupied by the regions indicated by D and E in FIG. 5(A). FIG. 7 shows an example of a case wherein a plurality of active layers are formed using the lateral growth layer.

FIG. 7 is an enlarged simplified view of a part of the substrate wherein the direction indicated by X represents the direction of crystal growth, i.e., the direction in which an on-current flows when a thin film transistor is formed thereon. The direction indicated by Y is a direction perpendicular to grain boundaries of the crystalline silicon.

As shown in FIG. 7, a plurality of active layers 702 are formed on a substrate 701 by patterning a crystalline silicon film obtained by the above-described steps. When the active layers 702 are formed, there is no residue of a nickel introduction region and crystal interfaces which have been formed by collision between lateral growth regions. FIG. 7 shows regions 703 and 704 where the nickel introduction region and the crystal interfaces have existed by broken lines.

Referring to a particular active layer, the direction in which a source region 705 and a drain region 706 are connected at the minimum distance substantially coincide with the direction of crystal growth. The present invention can be implemented through such an arrangement of active layers.

SECOND EMBODIMENT

The present embodiment refers to a case wherein a means for crystallization different from that in the first embodiment is used for crystallizing an amorphous silicon film. The principle of this means for crystallization is disclosed in Japanese Patent Laid-Open No. H6-232059 and No. H6-244103 by the inventors.

Since the basic configuration of the present embodiment is same as that in the first embodiment, the present embodiment will be described by referring only to the difference in the means for crystallization.

In FIG. 8(A), 801 designates a glass substrate. A quartz substrate or a silicon substrate may be used instead. 802 designates a silicon oxide film formed using a sputtering process. Preferably, an artificial quartz target is used for the sputtering.

After the silicon oxide film 802 is formed, patterning is performed to intentionally form a concave or convex pattern 803. Although the present embodiment referred to a rectangular fine linear pattern which is intentionally formed to constitute a convex portion, the same effect may be achieved by forming a concave portion. The height of this concave or convex portion 803 may be about one-half of that of the thickness of an amorphous silicon film to be formed later.

After the patterning is completed in a desired configuration, an amorphous silicon film 804 is formed to a thickness in the range from 150 to 3000 Å using a plasma CVD process or a low pressure thermal CVD process. When a low pressure thermal CVD process is employed, disilane ($Si_2H_6$), trisilane ($Si_3H_8$) or the like may be used as a film-forming gas.

Attention must be paid to the cleanness of the surface of the silicon oxide film 802 which serves as a buffer layer during the formation of the amorphous silicon film 804. As will be described later, a foreign substance on the surface of the silicon oxide film 802, if any, can become a site of segregation of a metal element for promoting crystallization where nucleation will start.

After the amorphous silicon film 804 is formed, it is irradiated with ultraviolet light in an oxygen atmosphere to form a very thin oxide film (not shown) on the surface of the amorphous silicon film 804. This oxide film is provided to improve wettability of a solution during a solution applying step at a subsequent introduction of the metal element (as an example, nickel is used in this embodiment).

Next, a nickel nitrate solution including nickel elements at a predetermined density is applied on the surface of the amorphous silicon film 804 to form an aqueous film which is not shown (FIG. 8(A)).

In the state shown in FIG. 8(A), spin coating is performed using a spinner to realize a state wherein nickel elements are retained on the amorphous silicon film 804 in contact therewith through the oxide film (not shown).

At this time, the amorphous silicon film 804 on the concave or convex pattern 803 is formed with a concave or convex portion 806 which conforms to the concave or convex portion 803. As a result, after the spin coating, the region around the convex portion 806 tends to be a region where nickel is localized in a high density by the surface tension. It provides an effect of facilitating crystallization (crystallization in a direction substantially parallel with the substrate) at a fourth step in a subsequent crystallization process.

Although the above-described solution applying step is performed on the amorphous silicon film 804 in the present embodiment, this step provides the same effect when performed it on the silicon oxide film 802 as a buffer layer before the formation of the amorphous silicon film 804. Further, the solution may be applied to the surfaces of both of the silicon oxide film 802 and amorphous silicon film 804.

When the state as shown in FIG. 8(A) is realized, removal of hydrogen is performed for about one hour in an inert atmosphere and, thereafter, a heating process is performed for 4-8 hours at a temperature in the range from 500 to 700° C., typically in the range from 550 to 600° C. to crystallize the amorphous silicon film 804. When it is formed on a glass substrate, the temperature is preferably equal to or lower than 650° C. taking the heat resisting properties of glass into consideration. This crystallization is assumed to proceed as follows.

As a first step, nickel is heated to be activated and is isotropically diffused in the amorphous silicon film 804 as indicated by the arrow (FIG. 8(B)).

Next, as a second step, migration of nickel occurs between the silicon oxide film 802 and amorphous silicon film 804 to be segregated to the concave or convex pattern 803. That is, the concave or convex portion 803 acts as a segregation site formed intentionally (FIG. 8(C)).

When the density of nickel in the concave or convex pattern 803 which has become a segregation site is about $1 \times 10^{20}$ cm$^{-3}$, crystalline nucleus is generated there, and crystallization proceeds in a direction substantially perpendicularly to the surface of the silicon film. A vertical growth region 807 formed in this third step is a region including nickel in a high density (FIG. 8(D)).

Then, as a fourth step, crystal growth proceeds in a direction substantially parallel with the surface of the silicon film from the above-described vertical growth region 807 as the starting point. A resultant lateral growth region 808 is formed by a plurality of columnar or acicular crystals in a relatively well aligned state and is therefore better than the vertical growth region 807.

Since the segregation site is formed in an intentional controlled manner, the crystal grains can be enlarged and grown without no influence from other crystal grains. That is, appropriate design of the segregation site makes it possible to obtain crystals of a desired size in a desired location.

Thus, a crystalline silicon film 809 as shown in FIG. 8(F) is obtained. It should be noted that the means for crystallization in the present embodiment is fundamentally different from the well-known graphio-epitaxy technique.

According to the graphio-epitaxy technique, desirable orientation of a crystalline silicon film is achieved by utilizing a nature that crystallization of an amorphous silicon film occurs on the most stable surface of the underlayer film whose surface configuration have been given regularity.

The present means for crystallization is characterized in that surface energy of a underlayer film is changed by changing the surface configuration to obtain a region where a metal element for promoting crystallization is easily segregated. Therefore, the technique which the surface configuration is changed in order to form crystallin nucleus is different from the graphio-epitaxy technique.

As described above, in the present embodiment, a rectangular fine linear pattern is formed as a segregation site, and a lateral growth region is formed from that pattern as the starting point. Thus, crystal growth proceeds in a direction perpendicular to the vertical direction of the linear pattern. Therefore, the present invention can be implemented by forming active layers in the same configuration as in the first embodiment (see FIG. 7).

With such a configuration including a concave or convex pattern on the silicon oxide film 802 which is a buffer layer for the amorphous silicon film 803, there is no need for forming the silicon oxide film as a mask on the amorphous silicon film unlike the first embodiment.

Since this eliminates the step of forming and patterning the silicon oxide film, there is an advantage in that the manufacturing steps can be simplified. At the same time, the surface of the amorphous silicon film will not be subjected to contamination such as contamination of a manufacturing apparatus.

Further, although it is stated for the first embodiment that the width of the nickel introduction region is preferably 10 μm or more, the linear pattern according to the present embodiment provides a sufficient effect even if it is as thin as a few aim. Therefore, the crystallization step in this embodiment will prove effective when demands will arise for fine processing techniques in future.

THIRD EMBODIMENT

The present embodiment shows an example of further improvement on crystallinity achieved by irradiating a crystalline silicon film obtained using the means for crystallization described in the first or second embodiment with laser beams or intense beams having energy similar thereto.

Specifically, in this example, the grain boundaries of the crystalline silicon in a lateral growth region formed by a plurality of columnar or acicular crystals are once melted and recombined thereafter to form a region which can be substantially regarded as a single crystal having no grain boundary of the crystalline silicon (such a region is referred to as "monodomain region").

The means for achieving the above-described object (referred to as "monocrystallization step by the inventors) will be described below. Steps up to the formation of a lateral growth region will not be described here because they may be in accordance with the means disclosed in the first or second embodiment.

First, a crystalline silicon film obtained using the means disclosed in the first or second embodiment is irradiated with laser beams or intense beams having energy similar thereto. In the present embodiment, laser beams are provided using a KrF excimer laser (having a wavelength of 248 nm), but a XeCl excimer laser (having a wavelength of 308 nm) may be used instead.

At this step, the columnar or acicular crystals forming the lateral growth region are locally heated to a high temperature under irradiation with laser beams. At this time, a metal silicide (nickel silicide in this embodiment) segregated at the grain boundaries of the crystalline silicon of the columnar or acicular crystals (indicated by 502 in FIG. 5(B)) is precedently melted.

At the grain boundaries of the crystalline silicon which have been instantaneously melted, the silicon lattice is rearranged, and silicon atoms are recombined with each other with preferable matching. This substantially eliminates the grain boundaries of the crystalline silicon and allows the lateral growth region itself to be formed as a monodomain region.

Further, since crystal defects such as dislocation and stacking faults are substantially eliminated at this monocrystallization step, the crystallinity of the areas which have originally been columnar or acicular crystals is also significantly improved.

The lateral growth region thus obtained is constituted by a monodomain region having substantially no grain boundary of the crystalline silicon therein and exhibits crystallinity comparable to that of a single crystal in the monodomain region.

Although the monocrystallization step has been described as using irradiation with laser beams by way of example, intense beams such as infrared light and ultraviolet light having similar energy be used in stead. RTA (rapid thermal annealing) is well-known as this type of technique.

RTA is a method wherein a material to be processed is irradiated with intense light such as infrared light or ultraviolet light from a lamp. It is characterized in that it can locally heat in the thin film at the surface of the material to be processed because it allows rise and fall in temperature at a high speed and thereby allows a short processing time in the range from several seconds to several tens seconds. Specifically, it is possible, for example, to anneal only a thin film over a glass substrate at a very high temperature on the order of 1000° C.

Further, the short processing time means a significant improvement on throughput of the manufacturing step and, therefore, this means can be regarded very effective from the viewpoint of productivity.

A lateral growth region formed as a monodomain region using any of the above-described means has substantially no grain boundary of the crystalline silicon. However, a difference in the energy condition remains in the interfaces between crystals where grain boundaries of the crystalline silicon have initially existed, although slightly. That is, the effect of suppressing the off-current can be still expected.

Therefore, when active layers are formed in the configuration as described in the first embodiment, although a slight reduction is expected in the effect of suppressing the off-current, it can be offset by an increase in the on-current achieved by the improvement on the crystallinity of the active layer as a whole.

FOURTH EMBODIMENT

The present embodiment will show an example of further improvement on crystallinity achieved on a crystalline silicon film obtained using the means for crystallization described in the first or second embodiment by performing a heat treatment step in an atmosphere including a halogen element on it.

Specifically, in this example, the metal element (nickel element) remaining in a crystalline silicon film which has been subjected to the above-described steps is removed utilizing a gettering effect of the halogen element and the lateral growth region is formed as a monodomain region simultaneously.

A description will now be made on a specific means for a monocrystallization step according to the present embodiment. Steps up to the formation of a lateral growth region will not be described here because they may be in accordance with the means disclosed in the first or second embodiment.

In this embodiment, however, since a heating process at a relatively high temperature must be performed, a quartz substrate or a silicon substrate having high heat-resisting properties as the substrate on which the device is to be formed.

First, when a crystalline silicon film is obtained using the means for crystallization described in the first or second embodiment, a heating process in performed at a temperature in the range from 700 to 1100° C., and typically in the range from 800 to 1000° C. At this time, the processing time is in the range from 1 to 24 hours, and typically in the range from 6 to 12 hours. It is important that the processing atmosphere is an atmosphere including a halogen element.

In the present embodiment, a heating process is performed for 6 hours at 950° C. in a nitrogen atmosphere including oxygen at a density of 10% (volumetric density) and HCl at a density of 3% relative to oxygen. The reason for the low density of oxygen is that a high oxygen density will not allow sufficient gettering effect because it results in formation of the oxide film at a too high speed.

Although the present embodiment shows an example wherein Cl is chosen as the halogen element and is introduced using a Hcl gas, one or a plurality of gases selected from among HF, $NF_3$, HBr, $Cl_2$, $F_2$ and $Br_2$ may be used instead. Further, it is generally possible to use a hydride of a halogen or an organic substance made of a halogen (carbohydrate).

At this step, nickel in the crystalline silicon film is gettered by an action of chlorine and is removed by being absorbed by a thermal oxidation film formed on the surface of the crystalline silicon film or by escaping into the atmosphere. Thus, nickel in the crystalline silicon film is removed to obtain a crystalline silicon film at a reduced nickel density.

The nickel removed in the above-described gettering step have been pushed out to and segregated at grain boundaries of the crystalline silicon (indicated by 502 in FIG. 5(B)) during crystallization. That is, it is assumed to have existed as a nickel silicide at the grain boundaries of the crystalline silicon.

The nickel which has existed as a silicide forms nickel chloride and escapes leaving a great number of unpaired combining hands of silicon uncombined from nickel at the grain boundaries of the crystalline silicon.

However, since the above-described step is performed at a relatively high temperature of 950° C., the unpaired combining hands of silicon are combined with each other. Unpaired combining hands which can not be filled up are terminated by hydrogen or the halogen element included in the crystalline silicon film.

Thus, the grain boundaries of the crystalline silicon are joined with high matching as a result of the recombination of silicon to leave substantially no grain boundary of the crystalline silicon. This makes it possible to form the lateral growth region itself as a monodomain region.

Further, since crystal defects such as dislocation and stack faults are substantially eliminated during the heating process at a relatively high temperature, the crystallinity of the areas which have originally been columnar or acicular crystals is significantly improved.

Analysis using an SIMS (secondary ion mass spectrometer) have proved that after the above-described step, the density of nickel in the crystalline silicon film is reduced in the range from one-to-several to one-to-several-thousand of that before the process.

When the gettering of nickel is finished, the thermal oxidation film which has served as the gettering site is removed. This step is necessary to prevent nickel from being diffused into the crystalline silicon film again.

Thus, nickel in the lateral growth region is removed by the heating process in a halogen atmosphere to a sufficient degree that creates no problem in the manufacture of a semiconductor device ($1 \times 10^{18}$ cm$^{-3}$), and the region is formed as a monodomain region having significantly improved crystallinity. Therefore, the configuration of the present invention makes it possible to form active layers having very high performance.

FIFTH EMBODIMENT

In the present embodiment, a description will be made with reference to FIGS. 9(A) through 9(D) on a thin film transistor having an active layer formed using a crystalline silicon film (strictly, only the lateral growth region thereof) formed using the means disclosed in the first through fourth embodiments.

Since steps up to the formation of an active layer have been described in detail in the first through fourth embodiments, the description of the present embodiment focuses on steps following them.

Figure 9A:
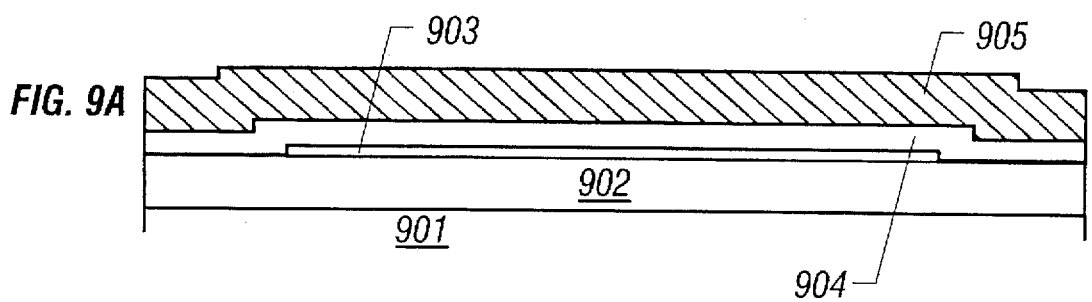
FIGS. 9(A) through 9(D) illustrate steps for fabricating a thin film transistor in accordance with the fifth embodiment. A

First, as shown in FIG. 9(A), a crystalline silicon film including a monodomain region is formed in accordance with the steps described in the first through fourth embodiments, and patterning is performed to form an active layer 903 constituted only by a lateral growth region. 901 designates a glass substrate, quartz substrate or silicon substrate, and 902 designates a silicon oxide film to serve as a buffer layer.

Next, a silicon oxide film 904 to serve as a gate insulating film is formed to a thickness of 1200 Å using a plasma CVD process. Another kind of insulating film such as a silicon oxide nitride film or silicon nitride film may be formed instead.

Next, an aluminum film 905 to constitute gate electrodes is formed to a thickness of 3000 Å using a sputtering process. The aluminum film 905 includes 0.2% scandium by weight. Thus, the state as shown in FIG. 9(A) is obtained.

After the aluminum film 905 is formed, a very thin anodic oxide film (not shown) is formed on the surface thereof. This anodic oxide film is obtained using an electrolyte which is an ethylene glycol solution including 3% tartaric acid neutralized with aqueous ammonia. That is, anodization is performed in this electrolyte using the aluminum film 905 as the anode and platinum as the cathode.

The anodic oxide film formed in this step has fine film quality and has a function of improving adhesion of a resist mask to be formed later. The thickness of this anodic oxide film (not shown) is on the order of 100 Å. Further, this thickness can be controlled by the applied voltage.

Next, the aluminum film 905 is patterned to form aluminum film patterns 906 in the form of islands which will serve as bases of gate electrodes. Although not clear on the figure, the aluminum film patterns 906 are all obtained from the same film and are electrically connected (FIG. 9(B)).

Figure 9B:
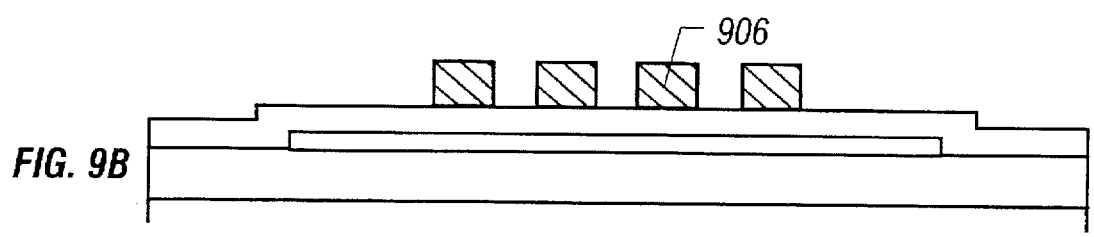

When the state as shown in FIG. 9(B) is obtained, the resist mask for patterning (not shown) is removed, and anodization is performed again using the aluminum film patterns 906 as the anode. This second anodization forms fine anodic oxide films 907. This anodization step is performed under the same conditions as for the formation of the above-described anodic oxide film.

The fine anodic oxide films 906 have a function of preventing hillocks from being produced on the surface of gate electrodes 908 in subsequent steps. Although the films thus formed are 800 Å thick and act only as protection films in the present embodiment, a film thickness as large as 1500 Å or more allows offset gate regions to be formed in a subsequent step of implanting impurity ions.

When the fine anodic oxide films 907 are formed, impurity ions are implanted in this state to form source and drain regions and floating island regions. Here, P ions are implanted to fabricate an N-channel type thin film transistor.

At this step, a source region 909 and a drain region 910 added with impurities at a high density are formed. Further, floating island regions 911 through 913 are formed between the gate electrodes 908, and base regions 914 to serve as channels are formed under the gate electrodes 908 on a self-alignment basis (FIG. 9(C)).

After the above-described step of implanting impurity ions, irradiation with laser light, infrared light or ultraviolet light is performed to anneal the regions into which ions have been implanted.

The source region 909, drain region 910, floating island regions 911 through 913 and base regions 914 are thus formed. Furthermore, a region of a low impurity density may be formed using a well-known technique between the regions into which impurity ions are implanted (the source region 909, drain region 910 and floating island regions 911 through 913) and the channel formation region (the base regions 914).

Next, a plasma hydrogenating process may be effectively performed for 0.5–1 hour at a temperature in the range from 300 to 350° C. This step adds hydrogen to the active layer 903 by 5 atom % or less ($1 \times 10^{21}$ cm$^{-3}$ or less), preferably $1 \times 10^{15}$ to $1 \times 10^{21}$ cm$^{-3}$ or less.

Since this hydrogen is active, it can neutralize and remove unpaired combining hands of silicon in the active layer 903 and levels at the interface between the active layer and the gate insulating film.

Figure 9C:
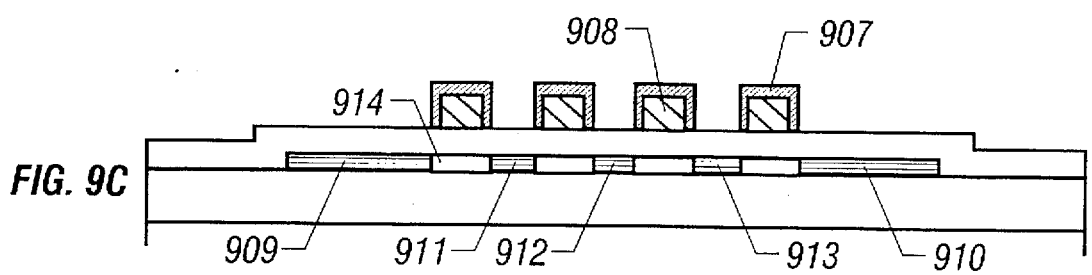

When the state as shown in FIG. 9(C) is thus obtained, an interlayer insulating film 915 is formed. The interlayer insulating film 915 is constituted by a silicon nitride film, silicon oxide nitride film, resin film or a film obtained by laminating such films. The use of a silicon nitride film is preferred because it can prevent the hydrogen added in the previous step from being released again from the device.

Then, contact holes are formed to form a source electrode 916 and a drain electrode 917. When the pixel TFT's of an active matrix type liquid crystal display are fabricated, lead-out electrode from the gate electrodes 908 are not required. However, for circuit TFT's used in the peripheral driving circuits, lead-out electrodes from the gate electrodes 909 must be formed simultaneously.

Figure 9D:
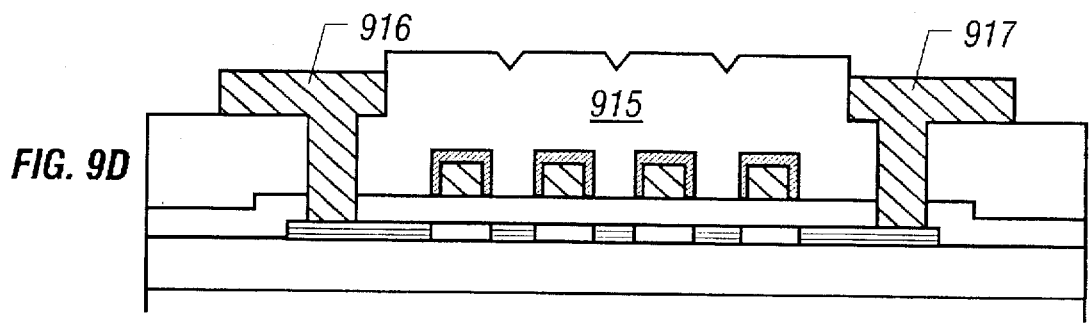

Further, a heating process is performed in a hydrogen atmosphere at 350° C. to hydrogenate the device as a whole, thereby completing a thin film transistor as shown in FIG. 9(D).

The thin film transistor thus formed is characterized in that the off-current is effectively suppressed and a high on-current can be maintained. Further, it is possible to configure an integrated circuit on the same substrate using such thin film transistors.

For example, it is possible to fabricate a versatile thin film transistor which, when applied to a liquid crystal display, can be used as either a pixel TFT required to have a low off-current or a driver circuit TFT required to operate at a high speed.

SIXTH EMBODIMENT

While the fifth embodiment showed an example of fabrication of a planar transistor, an active layer configured according to the present invention may be used in any type of thin film transistor in addition to the planar type.

In the present embodiment, an example of application to a reverse staggered thin film transistor will be described. Such a reverse staggered thin film transistor can be formed using the technique disclosed in Japanese unexamined patent publications No. H5-275452 or No. H7-99317. Therefore, the above-mentioned publications may be referred to for detailed requirements, thickness of a film and the like for this embodiment.

Figure 10A:
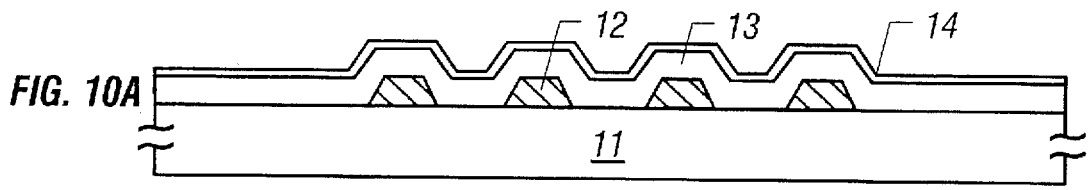
FIGS. 10(A) through 10(D) illustrate steps for fabricating a thin film transistor in accordance with the sixth embodiment.

First, in FIG. 10(A), 11 designates a substrate having an insulating surface. Gate electrodes 12 made of a conductive material are formed on the substrate 11. In FIG. 10(A), the gate electrodes 12 are all obtained from the same film and are electrically connected.

Further, in order to improve the withstand voltage, an anodization process which is a well-known technique may be performed to form anodic oxide films on the top and side surfaces of the gate electrodes 12. In addition, a configuration may be employed wherein the anodic oxide films formed using the anodization process are used to provide LDD regions or HRD regions. Thus technique is described in Japanese unexamined patent publication No. H7-169974 by the inventors.

Next, a silicon oxide film 13 to serve as a gate insulating film is formed using a plasma CVD process, and an amorphous silicon film (not shown) is formed thereon using a low pressure thermal CVD process. This amorphous silicon film (not shown) is crystallized using any of the means described in the first, second and third embodiments into a crystalline silicon film 14 that constitutes an active layer (FIG. 10(A)).

Since the fourth embodiment includes a heating process step at a high temperature range from 700 to 1100° C., it is difficult to apply this embodiment to the reverse staggered type as it is when the heat-resisting properties and thermal expansion of the gate electrodes 12 are taken into consideration. However, if a conductive material having more excellent heat resisting properties will be developed in future, such an embodiment will become possible.

Next, when the crystalline silicon film 14 is obtained, patterning is performed according to this invention such that the flowing direction of the on-current described in the first embodiment coincides with the direction of crystal growth in the lateral growth region to form an active layer 15 constituted only by the lateral growth region.

Next, a silicon nitride film (not shown) is formed so that it covers the active layer 15. Then, a resist mask (not shown) is provided on the silicon is nitride film, and patterning is carried out using a backside exposure process to selectively etch the silicon nitride film.

Island-shaped patterns 16 constituted by a silicon nitride film thus formed will act as a masking material in a subsequent ion implantation step. The island-shaped patterns 16 are all connected to each other because they are formed on a self-alignment basis by the gate electrodes 12.

Figure 10B:
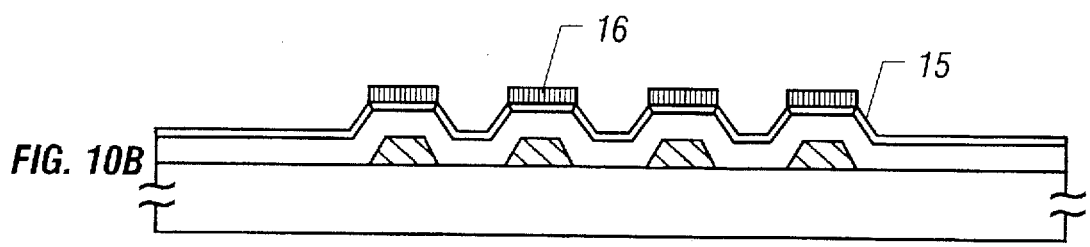

Thus, the state as shown in FIG. 10(B) is obtained. In this state, impurities for providing one conductivity type are implanted in the exposed active layer 15. This step may be performed using a well-known ion implantation process. After the ion implantation, laser annealing is performed to activate the impurity ions.

Thus, a source region 17, floating island regions 18 through 20 and a drain region 21 are formed on the active layer. The regions where ions have not been implanted due to the presence of the island-shaped patterns 16 become base regions 22. The base regions 22 are all connected to each other because they are formed on a self-alignment basis by the island-shaped patterns 16 (FIG. 10(C)).

Figure 10C:
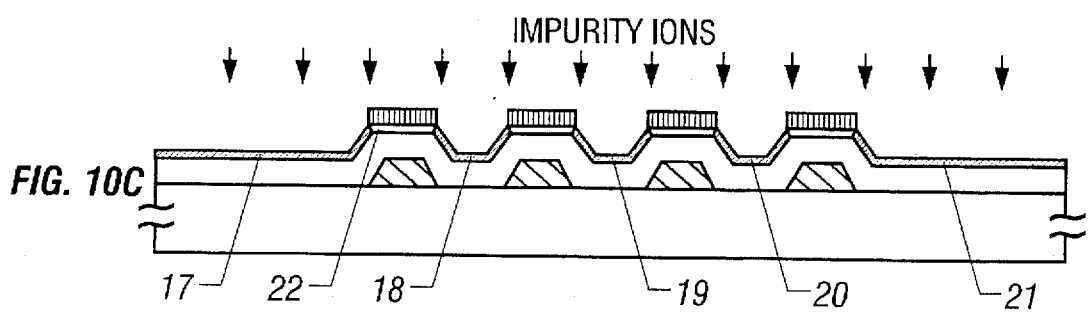

When the state as shown in FIG. 10(C) is obtained, a silicon oxide film 23 as an interlayer insulating film is formed using a plasma CVD process. Then, contact holes which extends to the source region 17 and the drain region 21 are formed.

Figure 10D:
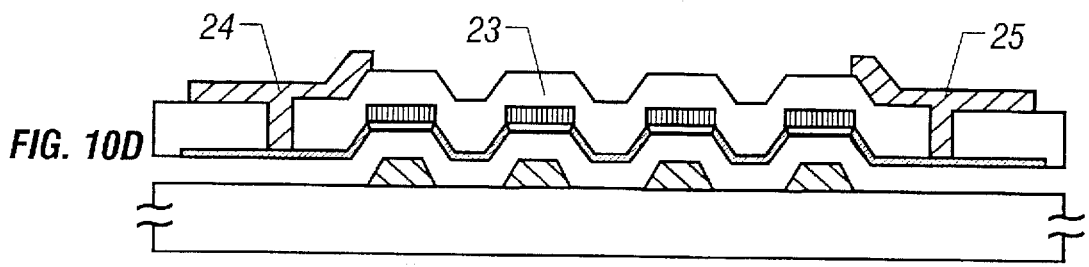

Thereafter, a source electrode 24 and a drain electrode 25 made of a conductive material are formed to complete a reverse staggered thin film transistor as shown in FIG. 10(D)).

As described above, the present invention can be applied to a reverse staggered thin film transistor with satisfactory results. A reverse staggered thin film transistor is advantageous it has high reliability because it is resistant to contamination or the like by the substrate 11 for structural reasons.

SEVENTH EMBODIMENT

The present embodiment shows an example of an active layer of a thin film transistor having the above-described configuration. More specifically, it relates to a technique for adding a high resistance region to channel formation regions (base regions).

Figure 11A:
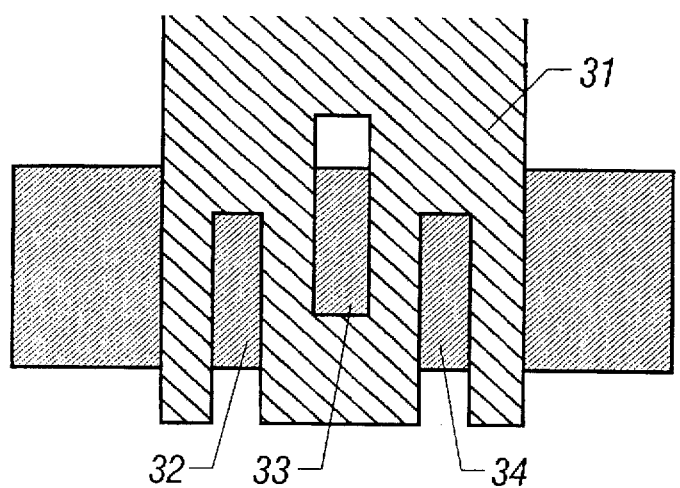
FIGS. 11(A) and 11(B) illustrate configurations of a gate electrode portion on an active layer in accordance with the seventh embodiment.

FIG. 11(A) shows the semiconductor layer in the form of island shown in FIG. 1(A) added with a gate region 31. With the gate electrode in such a configuration, it is possible to implant impurity ions using the gate electrode 31 as a mask to form floating island regions 32 through 34 on a self-alignment basis.

The behavior of the gate electrode 31 in response to application of a voltage has already been described and will not be described here. Further, an example of a N-channel type thin film transistor will be described below.

Figure 11B:
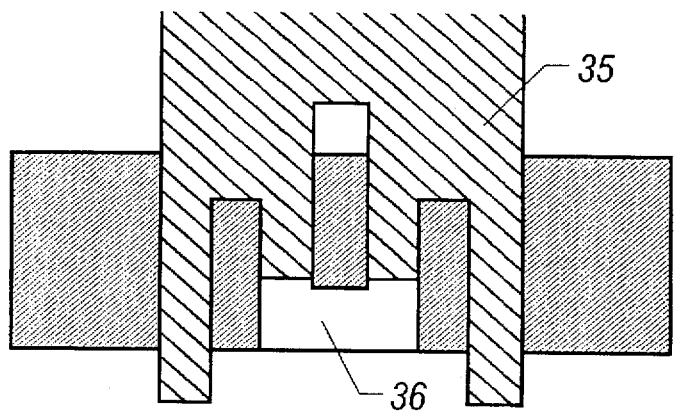

FIG. 11(B) shows a configuration obtained by etching a part of the gate electrode 31 in FIG. 11(A). The step of etching the gate electrode 35 may be performed after the floating island regions 22 through 24 are formed on a self-alignment basis by impurity ion implantation.

At this time, a region 36 in FIG. 11(B) to which the gate electrode 35 applies no voltage always becomes a substantially intrinsic semiconductor layer. That is, it becomes a region which acts as a region having a high resistance like a so-called offset.

Therefore, when a negative voltage is applied to the gate electrode 35 (when the TFT is off), the off-current is effectively suppressed because the high resistance region 36 substantially functions as an offset. When a positive voltage is applied to the gate electrode 35 (when the TFT is on), the high resistance region 36 have almost no effect on the on-current because the entire semiconductor layer in the form of islands serves as a path for flow of electrons.

Therefore, the configuration according to this embodiment allows formation of a thin film transistor in which the off-current is more preferably suppressed.

EIGHTH EMBODIMENT

Figure 11C:
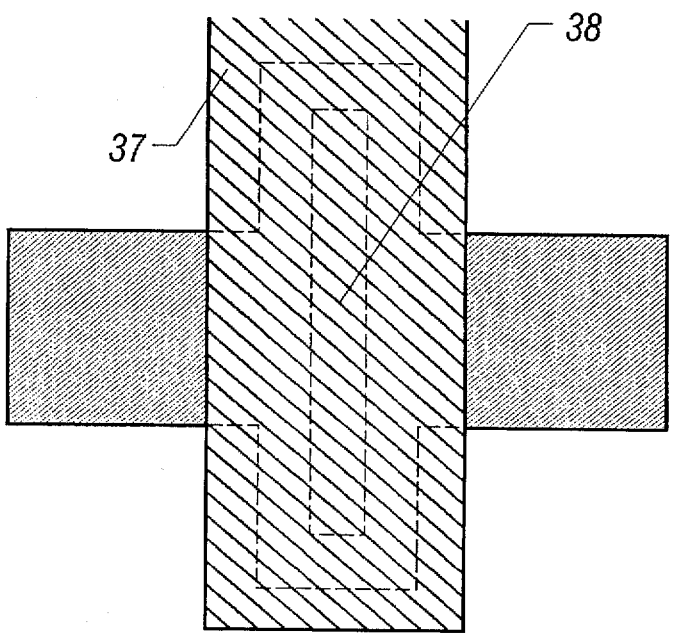
FIG. 11(C) illustrates a configuration of a gate electrode portion on an active layer in accordance with the eighth embodiment.

The present embodiment shows another example of an active layer of a thin film transistor having the above-described configuration. FIG. 11(C) illustrates a configuration around a semiconductor layer according to the present embodiment.

The present embodiment is characterized in that a channel formation region is completely covered by a gate electrode 37. 38 designates a floating island region provided under the gate electrode 37.

Such a configuration allows a reduction in the distance traveled by electrons when the thin film transistor is on, i.e., the substantial channel length. It is therefore possible to form a thin film transistor operating at a higher speed.

Another advantage of such a configuration is that, for example, when it is used for an active layer of a pixel TFT of an active matrix type liquid crystal display, the thin film transistor can be formed in a small size to improve the numerical aperture.

NINTH EMBODIMENT

The thin film transistors as described in the fifth and sixth embodiments may have a configuration such that it is formed not only on the surface of an insulator but also on an interlayer insulating film formed on a conductive film or a semiconductor device.

For example, it is possible to configure an integrated circuit having a three-dimensional structure in which a thin film transistor utilizing the present invention is formed on an integrated circuit on a silicon substrate.

An integrated circuit having such a three-dimensional structure is advantageous in that three-dimensional construction of a semiconductor device allows a large scale integrated circuit to be configured with the occupied area kept small. This feature will becomes more and more important in the current trend toward finer device sizes.

An active layer formed using the present invention significantly improves the on-off ratio of a thin film transistor and allows fabrication of a thin film transistor having performance higher than that available in the prior art.

Further, when applied to a liquid crystal display, such a thin film transistor is very advantageous in that it improves the performance of the liquid crystal display because it has performance which is satisfactory as either a pixel TFT required to have a low off-current or a driver TFT required to operate at a high speed.

As described above, the present invention provides a very advantageous technique from the industrial and commercial point of view.

What is claimed is:

1. A semiconductor device comprising:
   a crystalline semiconductor film formed on an insulating surface and including source and drain regions having one conductivity type, floating island regions located between said source and drain regions and having said one conductivity type, and a base region located between said source and drain regions and having a different conductivity type from said one conductivity type, wherein said semiconductor film comprises a plurality of columnar or acicular crystals extending substantially in parallel with said insulating surface.

2. A device according to claim 1, wherein said semiconductor film has a monodomain region which can be substantially regarded as a single crystal.

3. A device according to claim 1, wherein said semiconductor film comprises at least one of elements selected from among Fe, Co, Ni, Ru, Rh, Os, Ir, Cu and Au.

4. A device according to claim 1, wherein said columnar or acicular crystals extend in a uniform direction between said source and drain regions.

5. A device according to claim 1, wherein said semiconductor film comprises silicon.

6. A device according to claim 1, wherein a gate electrode is located adjacent to said base region with an insulating film interposed therebetween.

7. A semiconductor device comprising:
   a crystalline semiconductor film formed on an insulating surface and including source and drain regions having one conductivity type, floating island regions located between said source and drain regions and having said one conductivity type, and a base region located between said source and drain regions and having a different conductivity type from said one conductivity type, wherein said semiconductor film comprises a plurality of columnar or acicular crystals extending substantially in parallel with said insulating surface and grain boundaries of said columnar or acicular crystals extend substantially in a uniform direction between said source and drain regions.

8. A device according to claim 7, wherein said semiconductor film has a monodomain region which can be substantially regarded as a single crystal.

9. A device according to claim 7, wherein said semiconductor film comprises at least one of elements selected from among Fe, Co, Ni, Ru, Rh, Os, Ir, Cu and Au.

10. A device according to claim 7, wherein said semiconductor film comprises silicon.

11. A device according to claim 7, wherein a gate electrode is located adjacent to said base region with an insulating film interposed therebetween.

12. A semiconductor device comprising:
    a crystalline semiconductor film formed on an insulating surface and including source and drain regions having one conductivity type, floating island regions located between said source and drain regions and having said one conductivity type, and a base region located between said source and drain regions and having a different conductivity type from said one conductivity type, wherein said semiconductor film comprises a plurality of columnar or acicular crystals extending substantially in parallel with said insulating surface and said columnar or acicular crystals extend substantially in a uniform direction corresponding with a flowing direction of an on-current of said thin film transistor.

13. A device according to claim 12 wherein said semiconductor film has a monodomain region which can be substantially regarded as a single crystal.

14. A device according to claim 12, wherein said semiconductor film comprises at least one of elements selected from among Fe, Co, Ni, Ru, Rh, Os, Ir, Cu and Au.

15. A device according to claim 12, wherein an off-current of said thin film transistor flows along grain boundaries of said columnar or acicular crystals extending substantially in said uniform direction.

16. A device according to claim 12, wherein an off-current of said thin film transistor flows along said base region between said source and drain regions.

17. A device according to claim 12, wherein said semiconductor film comprises silicon.

18. A device according to claim 12, wherein a gate electrode is located adjacent to said base region with an insulating film interposed therebetween.

* * * * *